United States Patent
Zhu et al.

(10) Patent No.: US 8,696,922 B2
(45) Date of Patent: Apr. 15, 2014

(54) METHODS OF PLASMA ETCHING PLATINUM-COMPRISING MATERIALS, METHODS OF PROCESSING SEMICONDUCTOR SUBSTRATES IN THE FABRICATION OF INTEGRATED CIRCUITRY, AND METHODS OF FORMING A PLURALITY OF MEMORY CELLS

(75) Inventors: Hongbin Zhu, Boise, ID (US); Mark Kiehlbauch, Boise, ID (US); Alex Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 423 days.

(21) Appl. No.: 12/489,062

(22) Filed: Jun. 22, 2009

(65) Prior Publication Data
US 2010/0323523 A1  Dec. 23, 2010

(51) Int. Cl.
*C23F 1/00* (2006.01)
*H01L 21/311* (2006.01)

(52) U.S. Cl.
USPC ............................................ 216/75; 438/694

(58) Field of Classification Search
None
See application file for complete search history.

(56) References Cited

U.S. PATENT DOCUMENTS

| | | | |
|---|---|---|---|
| 5,001,079 A * | 3/1991 | van Laarhoven et al. | 438/666 |
| 5,599,424 A * | 2/1997 | Matsumoto et al. | 438/738 |
| 6,368,518 B1 * | 4/2002 | Vaartstra | 216/67 |
| 6,635,185 B2 * | 10/2003 | Demmin et al. | 216/64 |
| 2002/0101167 A1 * | 8/2002 | Shan et al. | 315/111.11 |
| 2004/0004056 A1 * | 1/2004 | Sasaki et al. | 216/22 |
| 2005/0081907 A1 * | 4/2005 | Lewis et al. | 136/243 |
| 2008/0121969 A1 * | 5/2008 | Sandhu et al. | 257/316 |
| 2009/0155967 A1 * | 6/2009 | Purayath et al. | 438/261 |

\* cited by examiner

*Primary Examiner* — Shamim Ahmed
*Assistant Examiner* — Bradford Gates
(74) *Attorney, Agent, or Firm* — Wells St. John P.S.

(57) ABSTRACT

A platinum-comprising material is plasma etched by being exposed to a plasma etching chemistry that includes $CHCl_3$, $CO_2$ and $O_2$. In one embodiment, a method of processing a semiconductor substrate in the fabrication of integrated circuitry includes forming metallic platinum-comprising nanoparticles over a material. A portion of the nanoparticles is masked and another portion of the nanoparticles is unmasked. The unmasked portion of the metallic platinum-comprising nanoparticles is plasma etched using a plasma etching chemistry comprising $CHCl_3$, $CO_2$ and $O_2$. Other embodiments are disclosed.

31 Claims, 8 Drawing Sheets

_Fig 4_

_Fig 5_

METHODS OF PLASMA ETCHING PLATINUM-COMPRISING MATERIALS, METHODS OF PROCESSING SEMICONDUCTOR SUBSTRATES IN THE FABRICATION OF INTEGRATED CIRCUITRY, AND METHODS OF FORMING A PLURALITY OF MEMORY CELLS

TECHNICAL FIELD

Embodiments disclosed herein pertain to methods of plasma etching platinum-comprising materials, to methods of processing semiconductor substrates in the fabrication of integrated circuitry, and to methods of forming a plurality of memory cells.

BACKGROUND

Platinum is a metal that is resistant to corrosion and oxidation. The electrical, chemical and physical properties of platinum make it particularly well-suited for some applications in integrated circuitry fabrication. For example, nanoclusters of platinum particles may be well-suited for utilization as charge-trapping centers of non-volatile memory cells.

A problem in using platinum is that its resistance to corrosion and oxidation also makes it difficult to subtractively pattern into desired shapes by etching. For instance, a chemical commonly used for etching platinum is a highly corrosive mixture of nitric acid and HCl. Unfortunately, such mixture will attack numerous other compositions associated with integrated circuitry, and thus may not be suitable during integrated circuitry fabrication.

It would be desirable to develop new methods for etching platinum, particularly for use in integrated circuit fabrication.

BRIEF DESCRIPTION OF THE DRAWINGS

FIG. 6 is a simplified block diagram of a memory system in accordance with an embodiment.

DETAILED DESCRIPTION OF EXAMPLE EMBODIMENTS

Embodiments of the invention encompass methods of plasma etching platinum-comprising material. One example embodiment is described with reference to FIGS. 1 and 2 with respect to a substrate 90, for example a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
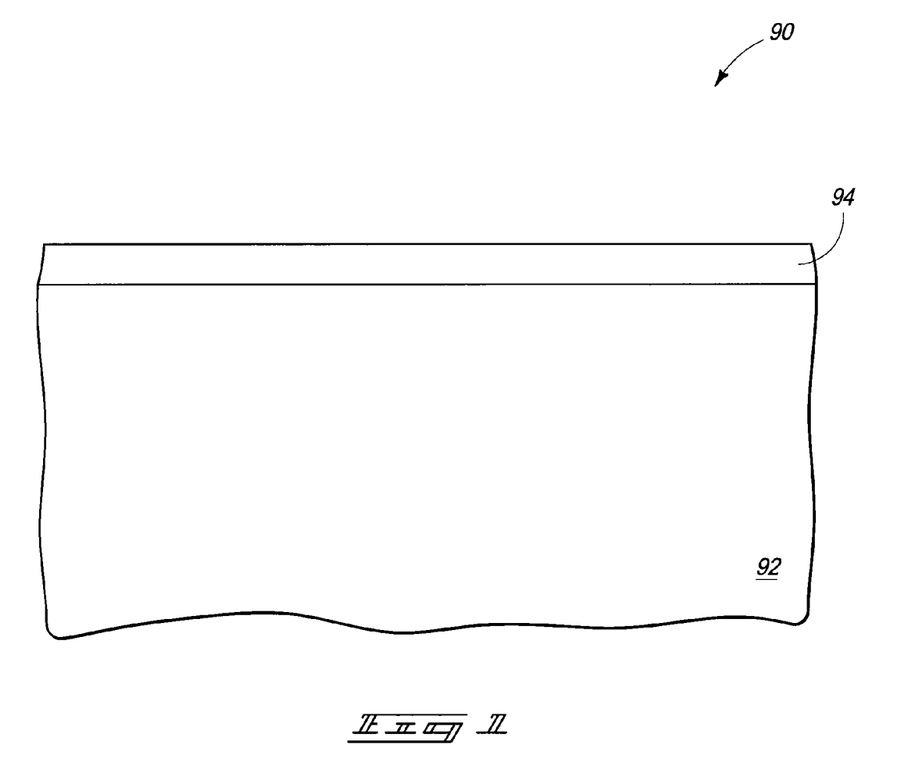
FIG. 1 is a diagrammatic sectional view of a substrate in process in accordance with an embodiment of the invention.

Substrate 90 comprises a base material 92 having a platinum-comprising material 94 formed thereover. Base material 92 may be homogenous or non-homogenous, and may comprise different composition layers. For example, such may comprise any one or combination of semiconductive material, insulative material and conductive material. Platinum-comprising material 94 may comprise, consist essentially of, or consist of elemental platinum. Alternately by way of example only, platinum-comprising material 94 may comprise, consist essentially of, or consist of an alloy of different elemental metals which includes platinum, and/or a metal compound which includes platinum. Platinum-comprising material 94 may be homogenous or non-homogenous, and may or may not have a planar outermost surface.

Figure 2:
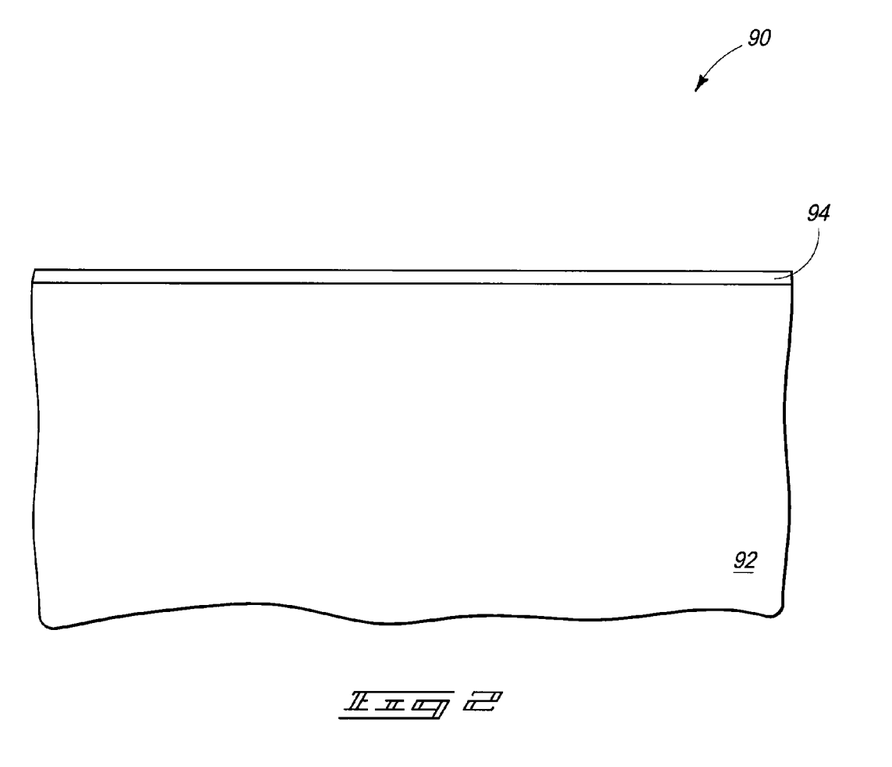
FIG. 2 is a view of the FIG. 1 substrate at a processing step subsequent to that shown by FIG. 1.

Referring to FIG. 2, platinum-comprising material 94 has been plasma etched by exposure to a plasma etching chemistry comprising $CHCl_3$, $CO_2$ and $O_2$. By way of examples, such may be conducted within an inductively coupled plasma chamber or within a capacitively coupled plasma chamber. Regardless, in one embodiment the plasma etching chemistry comprises a volumetric ratio $CHCl_3:CO_2:O_2$ of 1:0.5-6:0.2-6, in one embodiment comprises a volumetric ratio of $CHCl_3:CO_2:O_2$ of 1:2-4:0.2-1, and in one embodiment comprises a volumetric ratio of $CHCl_3:CO_2:O_2$ of about 1:3:0.3. In one reduction to practice example, the volumetric ratio of $CHCl_3:CO_2:O_2$ was about 3:9:1. Other components might additionally be provided in the plasma etching chemistry, for example one or both of $Cl_2$ and an inert gas such as argon, helium or neon.

In one embodiment, a substrate bearing a platinum-comprising material to be etched is placed within a suitable plasma etching chamber, and $CHCl_3$ is fed to the chamber at a flow rate from about 10 sccm to about 200 sccm. Additionally, $CO_2$ is fed to the chamber at a flow rate from about 30 sccm to about 300 sccm, $O_2$ is fed to the chamber at a flow rate from about 5 sccm to about 200 sccm, $Cl_2$ is fed to the chamber at a flow rate from about 0 sccm to about 300 sccm, and an inert gas is fed to the chamber at a flow rate of from 0 sccm to about 1,000 sccm. Such might be provided from separate injection points into the chamber or from one or more combined injection ports. As an example, such might be emitted into the chamber by a showerhead.

Any suitable ambient pressure may be used during the plasma etching, with a pressure from about 3 mTorr to about 20 mTorr being an example. Likewise, any suitable temperature may be used. For example in a single wafer processor, a support/susceptor atop which the substrate is received for plasma etching thereof may be used for temperature control. In one embodiment, temperature of such a support is controlled to be no greater than about 350° C. during the etching, in one embodiment no greater than about 100° C., in one embodiment no greater than 70° C., and in one embodiment no greater than 30° C. Prior art dry etching chemistries for platinum are understood to require one or both of high temperature and high power/bias voltage to achieve suitable etching of platinum. Utilizing a plasma etching chemistry comprising $CHCl_3$, $CO_2$ and $O_2$ enables lower temperature etching if desired, for example at no greater than 100° C. Regardless, in an inductively coupled plasma etching tool, an example power is from about 300 W to about 1,800 W, and an example bias voltage is from about 20V to about 200V, during the plasma etching. Single wafer or multi-wafer processors, whether existing or yet-to-be developed, may be used and etching parameters optimized by the artisan.

FIG. 2, by way of example only, depicts etching of an exposed portion of platinum-comprising material 94 having been conducted ineffective to completely remove such material from over material 92. Alternately, etching might be continued to completely remove all of platinum-comprising material 94 from over material 92, or to remove spaced portions of platinum-comprising material 94 from over material 92. Regardless, the platinum-comprising material might be outwardly exposed upon commencing of the plasma etching with the stated chemistry, or might be covered with another material that is etched by the same plasma etching chemistry to subsequently expose the platinum-comprising material.

Regardless, in one embodiment, the plasma etching may be selective to remove platinum-comprising material selectively relative to silicon dioxide-comprising material. In the context of this document, a selective etch requires etching of one material at a rate of at least 2:1 relative to another material upon outward exposure of both such materials. For example, where a platinum-comprising material is received over a silicon oxide-comprising material, the plasma etching of the platinum-comprising material may be conducted selectively relative to the silicon oxide-comprising material. For example, increasing quantity of $O_2$ in the etching chemistry provides increasing selectivity in etching platinum-comprising material relative to silicon dioxide. Further, providing $Cl_2$ in increasing quantities decreases selectivity in etching platinum-comprising material relative to a silicon dioxide-comprising material.

Figure 3:
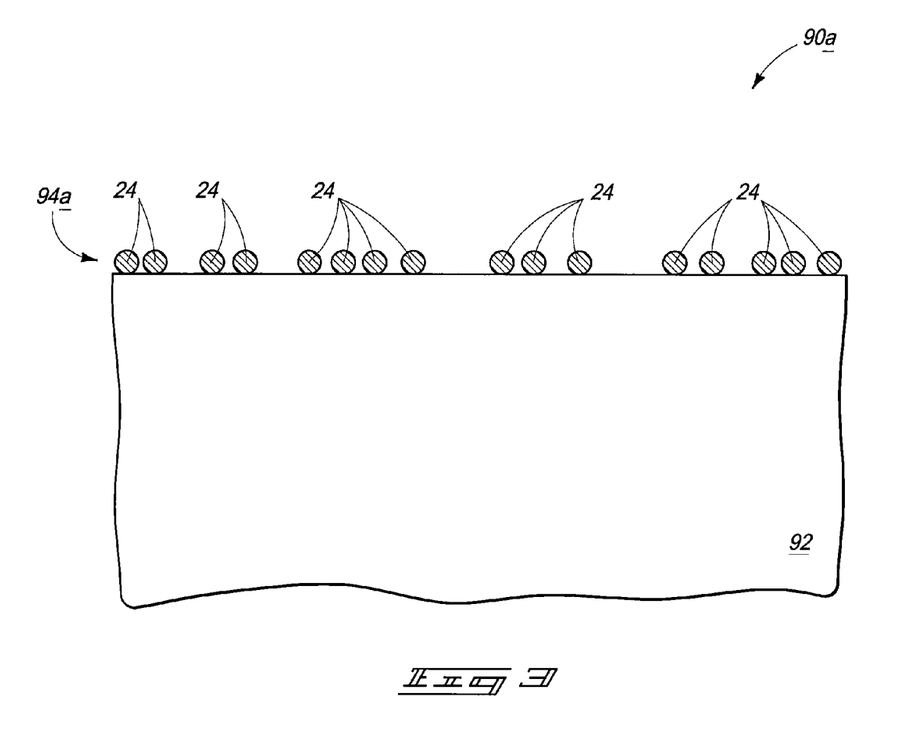
FIG. 3 is a diagrammatic sectional view of a substrate in process in accordance with an embodiment of the invention.
Figure 4:
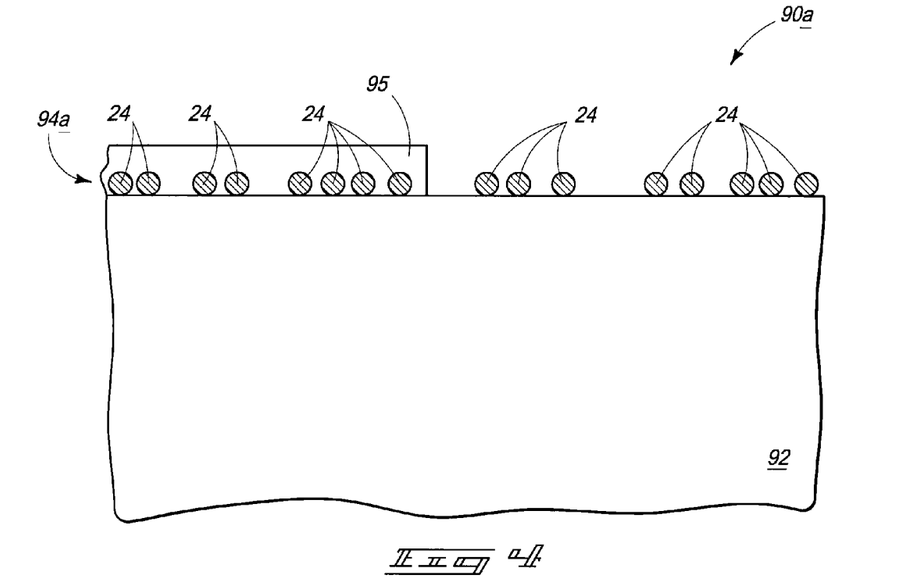
FIG. 4 is a view of the FIG. 3 substrate at a processing step subsequent to that shown by FIG. 3.
Figure 5:
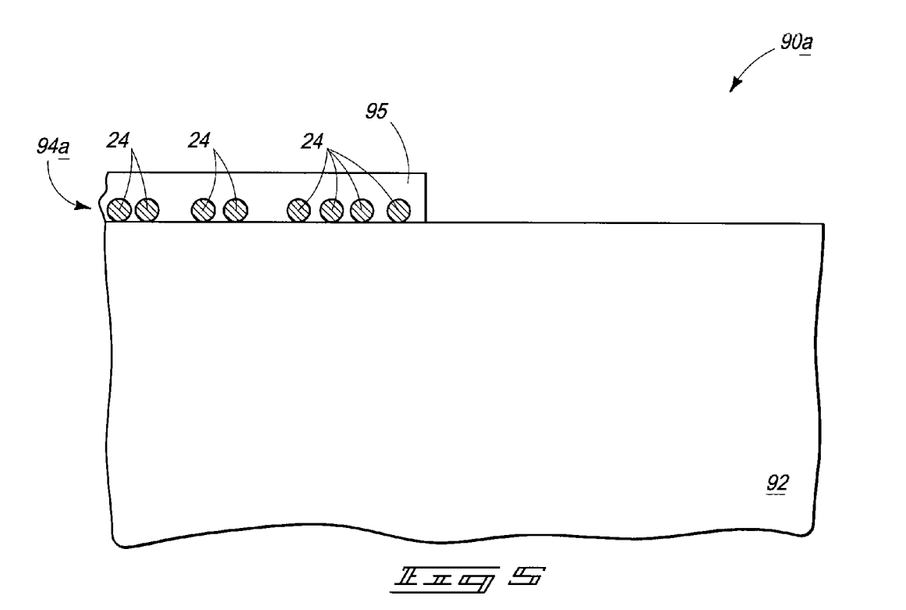
FIG. 5 is a view of the FIG. 4 substrate at a processing step subsequent to that shown by FIG. 4.

FIGS. 1 and 2 depict an example wherein a platinum-comprising material 94 upon commencing of the plasma etching constitutes a continuous layer of substrate 90. FIGS. 3-5 depict an alternate embodiment wherein a platinum-comprising material upon commencing of the plasma etching comprises a discontinuous layer of a substrate.

FIG. 3 depicts an alternate embodiment substrate fragment 90a. Like numerals from the first-described embodiment have been utilized in FIGS. 3-5, with some construction differences being indicated with the suffix "a" or with different numerals. Substrate 90a comprises a discontinuous layer 94a of platinum-comprising material. In one embodiment, layer 94a comprises metallic platinum-comprising nanoparticles 24 formed over a semiconductive material 92. The material of particles 24 may be of any composition described above for material 94. Particles 24 may be equally or unequally spaced, grouped, or clumped over material 92. In one embodiment, platinum-comprising nanoparticles 24 comprise nanodots of spherical shape having diameters of from about 1 nm to about 100 nm.

Etching may be conducted as described above in connection with the FIG. 2 etching to remove a portion or all, a portion of some, all of a portion, or all of metallic platinum-comprising nanoparticles 24. FIGS. 4 and 5 depict an example subsequent processing wherein all of a portion of discontinuous layer 94a is removed by etching from over material 92. Specifically, referring to FIG. 4, a patterned mask 95 has been formed as part of substrate 90a. Any suitable material 95 may be used, and which may be partially or wholly sacrificial. Mask 95 may be homogenous or non-homogenous, and may comprise multiple different composition layers. Photoresist is but one example. Regardless, FIG. 4 may be considered as depicting an example embodiment wherein layer 94a of metallic platinum-comprising nanoparticles 24 includes a masked portion over which material 95 lies, and an unmasked portion over which material 95 does not lie.

FIG. 5 depicts example subsequent processing wherein the unmasked portion of layer 94a of metallic platinum-comprising nanoparticles 24 has been plasma etched away from material 92 using a plasma etching chemistry comprising $CHCl_3$, $CO_2$ and $O_2$. Any of the example processing described above for etching of layer 94 in the first-described embodiment may be used.

Embodiments of the invention encompass methods of forming integrated circuitry using any one or more of the various above-described techniques. Examples include formation of transistor gates that may be used in many different types of integrated circuitry, for example in memory circuitry such as flash. A flash memory is a type of EEPROM (Electrically-Erasable Programmable Read-Only Memory) that may be erased and reprogrammed in blocks. Many modern personal computers have BIOS stored on a flash memory chip. Such BIOS is sometimes called flash BIOS.

A typical flash memory comprises a memory array that includes a large number of memory cells arranged in row and column fashion. The cells are usually grouped into blocks. Each of the cells within a block may be electrically programmed by charging a floating gate. The charge may be removed from the floating gate by a block erase operation. Data is stored in a cell as charge in the floating gate.

NAND is a basic architecture of flash memory. A NAND cell unit comprises at least one select gate coupled in series to a serial combination of memory cells (with the serial combination being commonly referred to as a NAND string).

Flash memory incorporates charge storage structures into transistor gates, and incorporates control gate structures over the charge storage structures. The charge storage structures may be immediately over gate dielectric. The charge storage structures comprise material capable of storing/trapping charge. The amount of charge stored in the charge storage structures determines a programming state. In contrast, standard field effect transistors (FETs) do not utilize charge storage structures as part of the transistors, but instead have a conductive gate directly over gate dielectric material. One example charge storage material comprises metallic platinum-comprising nanoparticles embedded in a high-k dielectric, as described in examples below.

FIG. 6. is a simplified block diagram of a memory system 500. The memory system includes an integrated circuit flash memory device 502 (e.g., a NAND memory device), that includes an array of memory cells 504, an address decoder 506, row access circuitry 508, column access circuitry 510, control circuitry 512, input/output (I/O) circuitry 514, and an address buffer 516. Memory system 500 also includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 7:
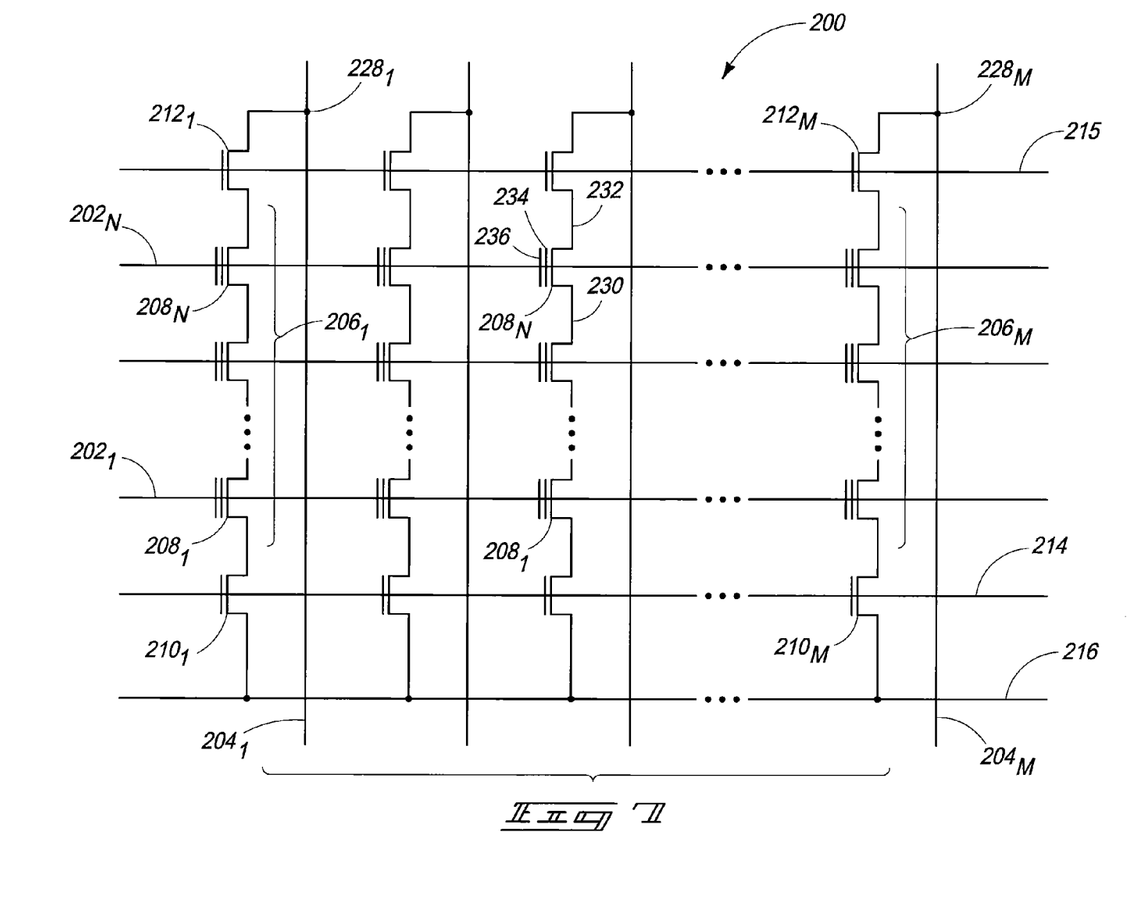
FIG. 7 a schematic of a NAND memory array in accordance with an embodiment.

FIG. 7 is a schematic of a NAND memory array 200. Such may be a portion of memory array 504 of FIG. 6. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes charge-storage transistors $208_1$ to $208_N$. The charge-storage transistors may use floating gate material to store charge, or may use charge-trapping material (such as, for example, metallic nanodots) to store charge.

The charge-storage transistors 208 are located at intersections of wordlines 202 and local bitlines 204. The charge-storage transistors 208 represent non-volatile memory cells for storage of data. The charge-storage transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first charge-storage transistor 208 of the corresponding NAND string 206. For example, the drain of source select gate 2101 is connected to the source of charge-storage transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last charge-storage transistor 208 of the corresponding NAND string 206. For example, the source of drain select gate $212_1$ is connected to the drain of charge-storage transistor $208_N$ of the corresponding NAND string $206_1$.

Charge-storage transistors 208 include a source 230, a drain 232, a charge storage region 234, and a control gate 236. Charge-storage transistors 208 have their control gates 236 coupled to a wordline 202. A column of the charge-storage transistors 208 are those transistors within a NAND string 206 coupled to a given local bitline 204. A row of the charge-storage transistors 208 are those transistors commonly coupled to a given wordline 202.

Figure 8:
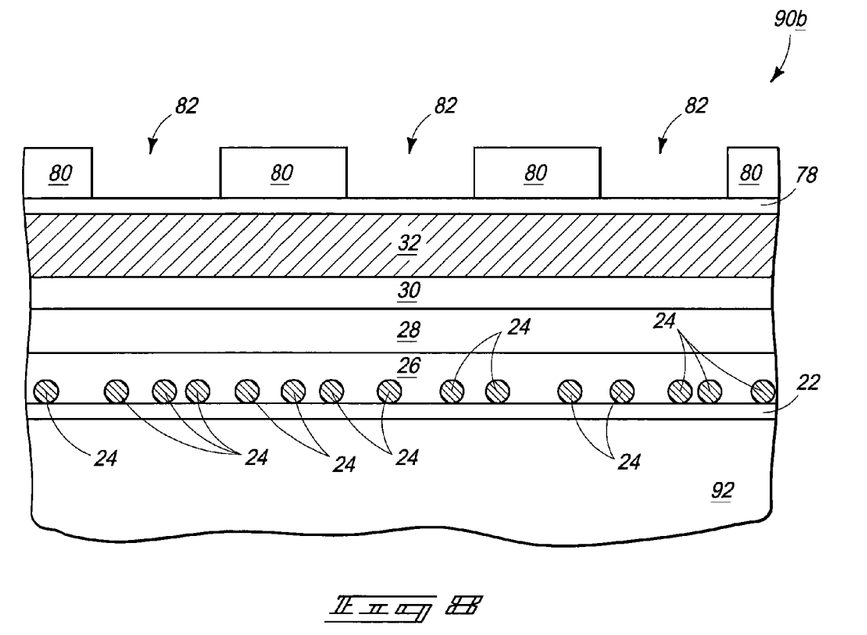
FIG. 8 is a diagrammatic sectional view of a substrate in process in accordance with an embodiment of the invention.
Figure 9:
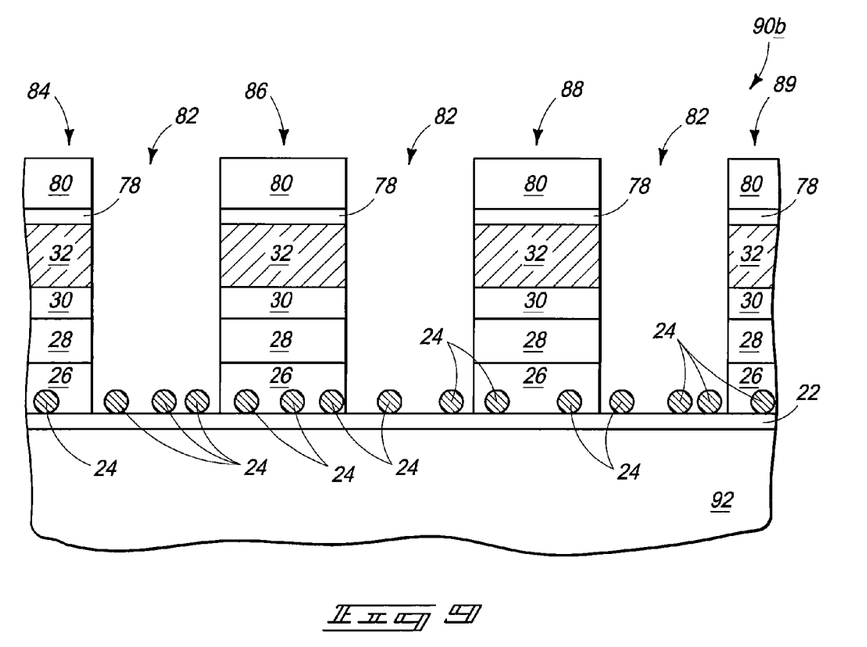
FIG. 9 is a view of the FIG. 8 substrate at a processing step subsequent to that shown by FIG. 3.
Figure 10:
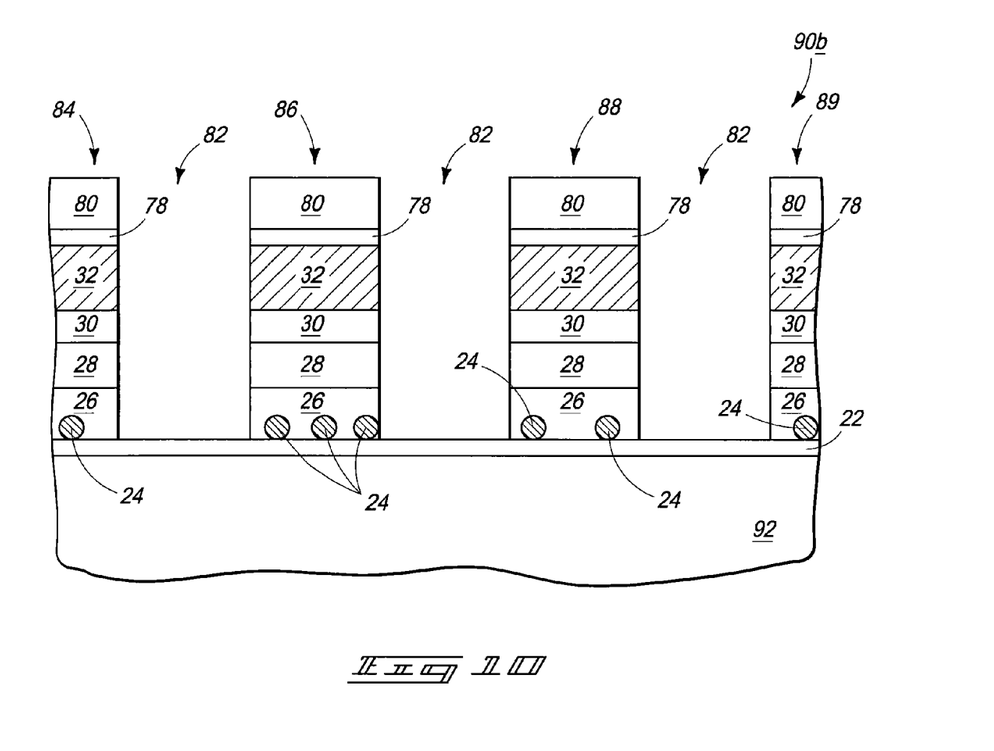
FIG. 10 is a view of the FIG. 9 substrate at a processing step subsequent to that shown by FIG. 9.

FIGS. 8-10 illustrate example processing which may be used to pattern memory cell gates across a NAND memory array region with respect to a substrate fragment in the fabrication of integrated circuitry. Like numerals from the above-described embodiments have been utilized where appropriate, with some construction differences being indicated with the suffix "a" or with different numerals. In one embodiment, substrate material 92 comprises, consists essentially of, or consists of, for example, monocrystalline silicon lightly-doped with background p-type dopant, although in other embodiments it could be, for example, any one of a number of semiconductive materials. A series of materials associated with memory cell fabrication have been formed over material 92. Specifically, a dielectric material 22 which will function as a tunnel dielectric has been deposited over semiconductor material of the substrate. Any existing or yet-to-be developed material is contemplated, with silicon dioxide being an example. An example thickness is about 60 Angstroms. Tunnel dielectric 22 may be homogenous or non-homogenous, for example comprising multiple different composition dielectric layers. Metallic platinum-comprising nanoparticles 24 have been formed over dielectric material 22.

A dielectric material 26 has been formed over and between those of nanoparticles 24 which are spaced from one another. Dielectric material 26 may be homogenous or non-homogenous. In one embodiment, material 26 is an oxide-comprising high k dielectric. In the context of this document, high k defines a dielectric material having a dielectric constant of at least 4.0. Example high k dielectric materials 26 include hafnium oxide, zirconium oxide, and/or aluminum oxide. Regardless, an example thickness range for material 26 above nanoparticles 24 is from about 20 Angstroms to about 25 Angstroms. In one embodiment, metallic-comprising nanoparticles 24 and dielectric material 26 in combination may be considered as comprising charge trapping material of the memory cells being fabricated.

Dielectric materials 28 and 30 have been formed over dielectric material 26. Such may be homogenous or non-homogenous, with an example material 28 comprising aluminum oxide and an example material 30 comprising silicon dioxide. An example thickness for material 28 is about 150 Angstroms, while that for material 30 is about 50 Angstroms. In one embodiment, dielectric materials 28 and 30 in combination may comprise a gate dielectric material received over metallic platinum-comprising nanoparticles 24. Dielectric materials 28 and 30 may not be used, and regardless dielectric material 26 may comprise gate dielectric material.

Control gate material 32 has been formed over dielectric material 30. Such may be homogenous or non-homogenous. Examples include one or more conductive elemental metals, alloys of conductive elemental metals, conductive metal compounds, and conductively doped semiconductive material. An example thickness for control gate material 32 is about 300 Angstroms. In one embodiment, materials 26, 28, 30 and 32 together may be considered as a stack of at least two different materials which has been formed over metallic platinum-comprising nanoparticles 24.

A dielectric capping material 78 is formed over control gate material 32, and a masking material 80 has been formed over capping material 78. Dielectric capping material 78 may be homogenous or non-homogenous, with silicon nitride and silicon oxynitride being examples. Masking material 80 may be homogenous or non-homogenous, with photoresist and/or any suitable existing or yet-to-be developed hard masking material being examples, and with or without anti-reflective coatings. Regardless, FIG. 8 depicts an example embodiment wherein a patterned material 80 has been formed over control gate material 32 and over a stack 26/28/30/32. In one embodiment, masking material 80 defines locations of memory cells, and has a plurality of openings 82 extending there-through which defines spaces that are to be formed between the memory cells. Masking material 80 may be formed using pitch multiplication techniques, for example whereby the width of material 80 and/or the spaces there-between are sublithographic.

Referring to FIG. 9, openings 82 are transferred through materials 78, 32, 30, 28 and 26 with one or more suitable acts of etching using one or more suitable etching chemistries. Such patterns materials 78, 32, 30, 28 and 26 into a plurality of memory cells 84, 86, 88 and 89, and exposes platinum-comprising nanoparticles 24 within spaces between the memory cells.

FIG. 10 shows construction 90b at a processing subsequent to that of FIG. 9 wherein metallic platinum-comprising nanoparticles 24 which were exposed between the memory cells have been plasma etched away from the substrate using a plasma etching chemistry comprising $CHCl_3$, $CO_2$ and $O_2$. Any of the processing described above for such etching of material 94 and nanoparticles 24 may be used. In subsequent processing, the memory cells may be incorporated into a NAND memory array, such as, for example, NAND memory arrays of the types described in connection with FIGS. 6 and 7.

In one embodiment, a method of forming integrated circuitry sequentially comprises forming dielectric material over a material, for example dielectric material 22 formed over semiconductive material 92. Metallic platinum-comprising nanoparticles are formed over dielectric material 22, for example nanoparticles 24.

An oxide-comprising high k dielectric is formed over the metallic platinum-comprising nanoparticles, for example material 26. Processing may proceed subsequently with deposition and patterning of material/layers above an oxide-comprising high k dielectric, for example as shown in FIG. 8.

Regardless, plasma etching is conducted of the oxide-comprising high k dielectric using a plasma etching chemistry comprising $CHCl_3$, $CO_2$ and $O_2$ to expose the metallic platinum-comprising nanoparticles. This is followed by plasma etching the exposed metallic platinum-comprising nanoparticles away from the semiconductor substrate using a plasma etching chemistry comprising $CHCl_3$, $CO_2$ and $O_2$. The plasma etching chemistry used in etching the oxide-comprising high k dielectric and in etching the metallic platinum-comprising nanoparticles may be the same chemistry or may be different chemistries. In one embodiment where the plasma etching chemistries are different, volumetric ratio of $CHCl_3$ to $CO_2$ is the same in the etching chemistry used in etching the oxide-comprising high k dielectric as used in etching the metallic platinum-comprising nanoparticles. Further and regardless, at least one of bias voltage and power may differ in the etching of the oxide-comprising high k dielectric and in the etching of the metallic platinum-comprising nanoparticles.

Using the FIGS. 8-10 embodiment as an example, etching could be conducted of the FIG. 8 substrate inwardly to the point of exposing dielectric material 26. Regardless of the chemistry or chemistries used to do such, plasma etching may then be conducted of material 26 using a plasma etching chemistry comprising $CHCl_3$, $CO_2$ and $O_2$ to the point of exposing the metallic platinum-comprising nanoparticles 24 which are received between constructions 84, 86, 88, and 89 being formed. Plasma etching is then continued using a plasma etching chemistry comprising $CHCl_3$, $CO_2$ and $O_2$ (which may be the same or different as that in etching of dielectric material 26) to remove the exposed metallic platinum-comprising nanoparticles 24 received within openings 82.

Plasma etching chemistries as described above which include $CHCl_3$, $CO_2$ and $O_2$ may be used to etch both materials 26 and 24. Such may or may not etch materials 24 and 26 at the same rate using the same chemistry or different chemistries, and/or using different plasma etching parameters. For example, decreasing relative $O_2$ concentration provides increasing rate of etch of hafnium oxide, zirconium oxide, and aluminum oxide. Analogously if $Cl_2$ is used, increasing quantities of $Cl_2$ used in part to form the plasma etching chemistry will also increase etch rate of hafnium oxide, zirconium oxide, and aluminum oxide. Accordingly, different chemistry and/or etching parameters may be used in etching dielectric material 26 and in the etching of metallic platinum-comprising nanoparticles 24 using a plasma etching chemistry comprising $CHCl_3$, $CO_2$ and $O_2$. Alternately, plasma etching chemistry and/or plasma etching parameters may be used which are constant in etching dielectric material 26 and metallic platinum-comprising nanoparticles 24 in producing the example FIG. 10 construction. Further in some embodiments, material 26 and metallic platinum-comprising nanoparticles 24 are etched simultaneously (for example upon exposure of nanoparticles 24 with material 26 being received there between) using one or more chemistries comprising $CHCl_3$, $CO_2$ and $O_2$.

In one reduction to practice example, a substrate bearing a layer of elemental platinum nanodots of about 30 Angstroms average diameter was positioned upon a susceptor of a Lam Kiyo 45™ inductively coupled plasma reactor. Plasma etching was conducted wherein 60 sccm $CHCl_3$, 180 sccm $CO_2$, 20 sccm $O_2$, 30 sccm $Cl_2$, and 240 sccm Ar were combined and injected into the chamber from a showerhead positioned over the substrate. Susceptor temperature was maintained at 70° C. and chamber pressure during the plasma etching was at 5 mTorr. Power to the inductive coils was provided at 1,200 Watts, and bias voltage on the susceptor was at 50 Volts. Such etched the exposed elemental platinum nanodots completely from the substrate in about six to twelve seconds.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of plasma etching a platinum material comprising exposing a material consisting of elemental platinum to a plasma etching chemistry comprising $CHCl_3$, $CO_2$ and $O_2$.

2. The method of claim 1 wherein the plasma etching chemistry comprises a volumetric ratio of $CHCl_3$:$CO_2$:$O_2$ of 1:0.5-6:0.2-6.

3. The method of claim 2 wherein the plasma etching chemistry comprises a volumetric ratio of $CHCl_3$:$CO_2$:$O_2$ of 1:2-4:0.2-1.

4. The method of claim 3 wherein the plasma etching chemistry comprises a volumetric ratio of $CHCl_3$:$CO_2$:$O_2$ of about 1:3:0.3.

5. The method of claim 1 wherein the etching is conducted within a chamber, $CHCl_3$ being fed to the chamber at a flow rate from about 10 sccm to about 200 sccm, $CO_2$ being fed to the chamber at a flow rate from about 30 sccm to about 300 sccm, $O_2$ being fed to the chamber at a flow rate from about 5 sccm to about 200 sccm, $Cl_2$ being fed to the chamber at a flow rate from 0 sccm to about 300 sccm, and an inert gas being fed to the chamber at a flow rate from 0 sccm to about 1,000 sccm.

6. The method of claim 1 wherein the plasma etching chemistry comprises $Cl_2$.

7. The method of claim 1 wherein the plasma etching chemistry comprises an inert gas.

8. The method of claim 1 wherein the plasma etching chemistry comprises $Cl_2$ and an inert gas.

9. The method of claim 1 wherein the plasma etching occurs at a pressure from about 3 mTorr to about 20 mTorr.

10. The method of claim 1 wherein temperature of a support over which the material is received is no greater than about 350° C. during the plasma etching.

11. The method of claim 10 wherein temperature of the support is no greater than about 100° C. during the plasma etching.

12. The method of claim 11 wherein temperature of the support is no greater than about 70° C. during the plasma etching.

13. The method of claim 12 wherein temperature of the support is no greater than about 30° C. during the plasma etching.

14. The method of claim 1 wherein the plasma etching is conducted within an inductively coupled plasma chamber.

15. The method of claim 14 wherein power is from about 300 W to about 1,800 W during the plasma etching, and bias voltage is from about 20V to about 200V during the plasma etching.

16. The method of claim 1 wherein the plasma etching is conducted within a capacitively coupled plasma chamber.

17. The method of claim 1 wherein the elemental platinum material is received over a silicon oxide material, the plasma etching of the elemental platinum material being selective relative to the silicon oxide material.

18. A method of plasma etching a platinum material comprising exposing a material consisting of elemental platinum to a plasma etching chemistry comprising $CHCl_3$, $CO_2$, $O_2$ and $Cl_2$; the plasma etching chemistry comprising a volumetric ratio of $CHCl_3:CO_2:O_2$ of about 3:9:1, temperature of a support over which the material is received being no greater than about 100° C. during the plasma etching.

19. The method of claim 18 wherein the platinum material upon commencing of the plasma etching comprises a discontinuous layer of a substrate.

20. The method of claim 18 wherein the platinum material upon commencing of the plasma etching comprises a continuous layer of a substrate.

21. A method of processing a semiconductor substrate in the fabrication of integrated circuitry, comprising:
    forming a masked portion and an unmasked portion of a material consisting of metallic elemental platinum nanoparticles over a material; and
    plasma etching the unmasked portion of the metallic elemental platinum nanoparticles using a plasma etching chemistry comprising $CHCl_3$, $CO_2$ and $O_2$.

22. The method of claim 21 wherein the forming comprises depositing a layer of the nanoparticles over the material followed by depositing a masking material.

23. The method of claim 21 wherein the plasma etching removes all of the nanoparticles from the unmasked portion.

24. The method of claim 21 wherein the nanoparticles comprise nanodots.

25. A method of forming integrated circuitry sequentially comprising:
    forming dielectric material over semiconductive material;
    forming a material consisting of metallic elemental platinum nanoparticles over the dielectric material;
    forming an oxide-comprising high k dielectric over the metallic elemental platinum nanoparticles;
    plasma etching the oxide-comprising high k dielectric using a plasma etching chemistry comprising $CHCl_3$, $CO_2$ and $O_2$ to expose the metallic elemental platinum nanoparticles; and
    plasma etching the exposed metallic elemental platinum nanoparticles using a plasma etching chemistry comprising $CHCl_3$, $CO_2$ and $O_2$.

26. The method of claim 25 wherein the plasma etching removes all of the exposed nanoparticles from over the dielectric material.

27. The method of claim 25 wherein the plasma etching chemistry used in etching the oxide-comprising high k dielectric and in etching the metallic elemental platinum nanoparticles are the same chemistry.

28. The method of claim 27 wherein at least one of bias voltage and power differs in the etching of the oxide-comprising high k dielectric and in the etching the metallic elemental platinum nanoparticles.

29. The method of claim 25 wherein the plasma etching chemistry used in etching the oxide-comprising high k dielectric and in etching the metallic elemental platinum nanoparticles are different.

30. The method of claim 29 wherein volumetric ratio of $CHCl_3$ to $CO_2$ is the same in the etching chemistry used in etching the oxide-comprising high k dielectric and used in etching the metallic elemental platinum nanoparticles.

31. The method of claim 25 wherein at least some of said plasma-etching of the oxide-comprising high k dielectric and at least some of said plasma etching of the exposed metallic elemental platinum nanoparticles are conducted simultaneously.

* * * * *